United States Patent [19]

Kogawa et al.

[11] Patent Number: 5,472,563
[45] Date of Patent: Dec. 5, 1995

[54] PRINTED CIRCUIT BOARD AND METHOD AND APPARATUS FOR MAKING SAME

[75] Inventors: Kiyonori Kogawa, Hiratsuka; Nobuaki Ooki; Masami Kawaguchi, both of Hadano; Motoyo Wajima, Yokohama; Haruo Akahoshi; Akira Nagai, both of Hitachi, all of Japan

[73] Assignee: Hitachi, Ltd., Tokyo, Japan

[21] Appl. No.: 265,050

[22] Filed: Jun. 24, 1994

Related U.S. Application Data

[63] Continuation of Ser. No. 960,219, Oct. 13, 1992, abandoned, which is a continuation of Ser. No. 584,123, Sep. 18, 1990, abandoned.

[30] Foreign Application Priority Data

Sep. 22, 1989 [JP] Japan ................................ 1-247319

[51] Int. Cl.$^6$ ........................................ B44C 1/22
[52] U.S. Cl. ................ 156/629.1; 156/313; 216/33; 427/98; 427/305
[58] Field of Search ...................... 156/629, 313, 156/902, 629.1; 427/98, 305; 216/33

[56] References Cited

U.S. PATENT DOCUMENTS

| | | | |
|---|---|---|---|
| 2,551,591 | 5/1951 | Foord | 174/259 |
| 4,002,778 | 1/1977 | Ballis et al. | 427/98 |
| 4,180,608 | 12/1979 | Del | 156/330 |
| 4,225,379 | 9/1980 | Ishii et al. | 156/629 |
| 4,434,022 | 2/1984 | Kamada et al. | 156/629 |
| 4,554,184 | 11/1985 | Canestaro et al. | 427/345 |

*Primary Examiner*—John J. Gallagher
*Attorney, Agent, or Firm*—Kenyon & Kenyon

[57] ABSTRACT

The present invention provides a printed circuit board which is high in acid resistance, mechanical strength at high temperature and bond strength, a method for making the printed circuit board and an apparatus used for making the printed circuit board. The technique of the present invention is characterized in that a metallic film having metal particles discretely distributed therein is provided on a roughened surface of copper circuit pattern on an insulating substrate which has been oxidized to form copper oxide and thereafter reduced.

14 Claims, 4 Drawing Sheets

PRINTED CIRCUIT BOARD AND METHOD AND APPARATUS FOR MAKING SAME

This application is a continuation of U.S. patent application Ser. No. 07/960,219 filed on Oct. 13, 1992, which is a continuation of application Ser. No. 07/584,123 filed on Sep. 18, 1990, both now abandoned.

BACKGROUND OF THE INVENTION

Field of the Invention

The present invention relates to a printed circuit board improved in adhesion between copper circuit layer and resin layer, a method for making such a board, and an apparatus used for making such a board.

Hitherto, for bonding resin to metal, it has been known to form an oxide layer on the surface of metal for improving adhesion as disclosed in "Plating and Surface Finishing", Vol. 69 No 6, pp 96–pp 99 (Jun. 1982) because direct bonding to a smooth surface of a metal does not afford sufficient adhesion. However, many of the metal oxides generally have the problem that upon contact with an acidic aqueous solution, the oxide readily hydrolyzes and dissolves as a metal ion.

Various methods have been studied for surface treatment of copper for the purpose of bonding together copper and resin. It is difficult to obtain sufficient adhesion by bonding a resin to the surface of copper without any such treatment. Therefore, for improving adhesion, formation of an oxide layer of cuprous oxide, cupric oxide, or the like on the surface of copper by various methods has been studied as method for surface treatment of copper. For example, it has been known to treat the surface of copper to which resin is to be bonded, with an alkaline aqueous solution containing potassium persulfate or sodium chlorite to form an oxide layer. Such a method for forming a copper oxide layer is very effective for improvement of adhesion. Generally oxides of copper are readily dissolved by hydrolysis upon contact with acid and so contact with acid must be avoided during the period from treatment to bonding. Furthermore, even after bonding, if acid treatment is conducted, any exposed portion of the oxide layer such as at bonding interface which is exposed at end portion of the cut surface, or at a hole pierced through the bonded surface, dissolves as acid penetrates into interface. As a result the oxide layer of bonding interface is lost. This phenomenon is not preferred for bonding. This phenomenon is a serious problem in laminating and bonding processes for making a multi-layer printed wiring board because they include a step of making through-holes which pierce through bonding interface and step of acid treatment for plating of through-holes.

For solving the above problems, it has been proposed in Japanese Patent Kokai No. 61-176192 to form a film that is resistive to acids by forming a copper oxide layer on the surface of copper and thereafter chemically reducing the oxide layer.

According to the method proposed above, the bonding interface between surface of copper and epoxy resin or polyimide resin is excellent in acid resistance and bonding strength, but mechanical strength at high temperatures is not sufficient and thus this method is still unsatisfactory for printed circuit boards which require high reliability.

SUMMARY OF THE INVENTION

The present invention provides a printed circuit board which has high acid resistance, high mechanical strength at high temperatures and high bonding strength, and a method for making the printed circuit board and an apparatus used for making the printed circuit board.

In a first embodiment of the present invention a printed circuit board has a copper circuit pattern that is formed on an insulating substrate. A metal film having metal particles discretely distributed is provided on a roughened surface of the copper circuit pattern which has been reduced after formation of dark brown/black copper oxide.

In a second embodiment of the present invention the multi-layer printed circuit board has a copper circuit pattern that is formed on one side or both sides of an insulating substrate. A metal film having metal particles discretely distributed therein is provided on a roughened surface of the copper circuit pattern which has been reduced after formation of dark brown/black copper oxide, thereby to form a layered body and two or more of the layered bodies are laminated through an insulating resin layer to make a multi-layer structure.

A method for making printed circuit boards according to a third embodiment of the present invention is includes a step of forming a dark brown/black copper oxide on a roughened surface of copper circuit pattern on an insulating substrate; a step of reducing said copper oxide, and a plating step of forming a metal film having metal particles discretely distributed therein on the surface of the reduced copper oxide.

In this third embodiment the reducing step comprises reducing the copper oxide with a boron based reducing agent and the plating step comprises carrying out plating with a solution containing a boron compound and nickel or cobalt free from palladium.

In this third embodiment there is no treatment with water between the reducing step and the plating step.

Furthermore, the method could include a step of keeping the surface of reduced copper oxide in the state being covered with the boron based reducing agent between the reducing step and the plating step.

The method could also include a step of keeping the surface of the reduced copper oxide in the state of being covered with non-oxidizing gas between the reducing step and the plating step.

Additionally the method could include a pre-dipping step of removing an oxide film produced spontaneously on the surface of reduced copper oxide in the boron compound solution of the plating step between the reducing step and the plating step.

In the method the boron based reducing agent and the boron compound solution could contain at least one material selected from the group consisting of dimethylamine, diethylamineborane, ammonia borane and sodium borohydride.

Also in the method the concentration of reducing agent in the boron compound solution of the plating step can be nearly equal to that in the boron based reducing agent.

A method for making a multi-layer printed circuit board according to another embodiment of the present invention includes the steps of: forming a dark brown/black copper oxide layer on a roughened surface of copper circuit pattern or both sides of an insulation substrate; forming, in a plating step, a metallic film having metal particles discretely distributed therein on the surface of the reduced copper layer to form a layered body, and laminating the layered bodies as a basic unit through an insulating resin layer to form a multi-layer construction.

In a fifth embodiment of the present invention an apparatus for producing a printed circuit board includes an oxidizing tank for forming dark brown/black copper oxide on the roughened surface of a copper circuit pattern on an insulating substrate of a printed circuit board; a reducing tank for reducing said copper oxide; a plating tank for plating the surface of the reduced copper oxide; and a container for enclosing the printed circuit board to provide non-oxidizing atmosphere therein.

A polished copper surface is flat and so cannot afford sufficient adhesion to a prepreg layer.

However, the roughened surface copper circuit pattern on an insulating substrate has high adhesion to prepreg layer owing to anchoring effect.

Further sufficient adhesion and acid resistance can be imparted when a copper oxide film is formed on surface of copper and is reduced to metallic copper, thereby to form fine irregularities on the surface of copper.

Nickel or cobalt is chemically plated on the surface of the thus obtained reduced copper. In this case, nickel or cobalt is plated at a small thickness of 10 Å–2000 Å not so as to fill up the irregularities formed on the surface of reduced copper by reduction of copper oxide.

The surface of reduced copper has the problem that it is mechanically broken to cause reduction of bonding strength for epoxy resin and polyimide resin which are bonded at a high temperature of 170–200° C., but when the surface of reduced copper is plated with nickel or cobalt, the surface has high strength and becomes stable even if it is plated at high temperature.

In order to make the surface of this reduced copper more strong and more stable, it is necessary to uniformly and stably deposit nickel or cobalt by chemical plating on the surface of metal.

For this purpose, treatment with palladium before plating or adding palladium to a plating solution may be employed to enhance activity of nickel or cobalt. However, palladium is high in adsorbability and so is adsorbed to the surface of insulating layer of printed circuit board. The adsorbed palladium cannot be sufficiently removed by washing with water and nickel or cobalt is deposited on the remaining palladium to bring about poor electrical insulation.

However, when a boron based reducing agent containing no palladium is used as a reducing agent for reducing copper oxide and a boron compound solution containing no palladium is used as plating solution for nickel or cobalt, no palladium remains and so it cannot occur that nickel or cobalt is deposited on remaining palladium and thus there occurs no problem of poor electrical insulation.

By carrying out no washing with water, phenomena such as oxidation with air of the surface of reduced copper can be inhibited and an active state is maintained. As a result, uniform thin plating layer is formed.

Furthermore, by keeping the reduced surface in the state of being covered with the above boron based reducing agent or with non-oxidizing gas or providing a step of pre-dipping for removing oxide film spontaneously produced on the reduced surface in the boron compound solution of the above plating step, oxidation of the surface of the reduced copper oxide is inhibited and phenomena such as oxidation of the surface of reduced copper with air are inhibited and the active state is maintained. As a result, a uniform thin plating layer can be formed.

Since thickness of the plating layer formed is small, the plating layer is formed as a metallic film having metal particles discretely distributed therein. Therefore, the irregularities on the surface of reduced copper are maintained and besides, the above-mentioned anchoring effect is increased by these metal particles and adhesion between copper circuit pattern and prepreg layer is further increased.

BRIEF DESCRIPTION OF THE DRAWINGS

FIG. 1 is a cross-sectional view of copper surface to be treated.

FIG. 2 is a cross-sectional view of a multi-layer printed circuit substrate.

FIG. 3 is an enlarged schematic cross-sectional view of copper surface to be treated.

DETAILED DESCRIPTION

The present invention will be explained with reference to lamination for making a multi-layer printed circuit board.

Example 1

Step-1: A copper surface of a copper-clad glass fabric-containing polyimide resin laminate was immersed in an aqueous solution containing 50 g/l of $CuCl_2.2H_2O$ and 500 g/l of HCl (36%) at 40° C. for 1 minute to carry out etching of the surface.

Step-2: The above sample was washed with water and then treated with an aqueous solution containing 30 g/l of $NaClO_2$, 10 g/l of $Na_3PO_4.12H_2O$, and 5 g/l of NaOH at 75° C. for 2 minutes to form dark brown/black copper oxide on the surface.

Step-3: The sample was washed with water and then, treated with an aqueous solution containing 5 g/l of dimethylamineborane at 40° C. for 2 minutes to reduce the copper oxide.

Step-4: Without washing with water, the sample, retaining thereon the aqueous solution containing dimethylamineborane, was immersed in an aqueous solution containing 15 g/l of $NiSO_4.7H_2O$, 60 g/l of $Na_3C_6H_5O_7.2H_2O$, and 5 g/l of $(CH_3)_2NHBH_3$ at 35° C. for 5 minutes to deposit nickel.

Step-5: The copper-clad laminates subjected to the above treatments and having nickel deposited thereon were washed with water and dried and then, were laminated through a prepreg comprising a glass fabric immpregnated with a polyimide resin and were bonded by applying a pressure of 30 kgt/cm$^2$ for 120 minutes at 200° C.

Next, apparatus for producing a printed circuit board produced in this way and structure of the printed circuit board will be explained.

Figure 4:
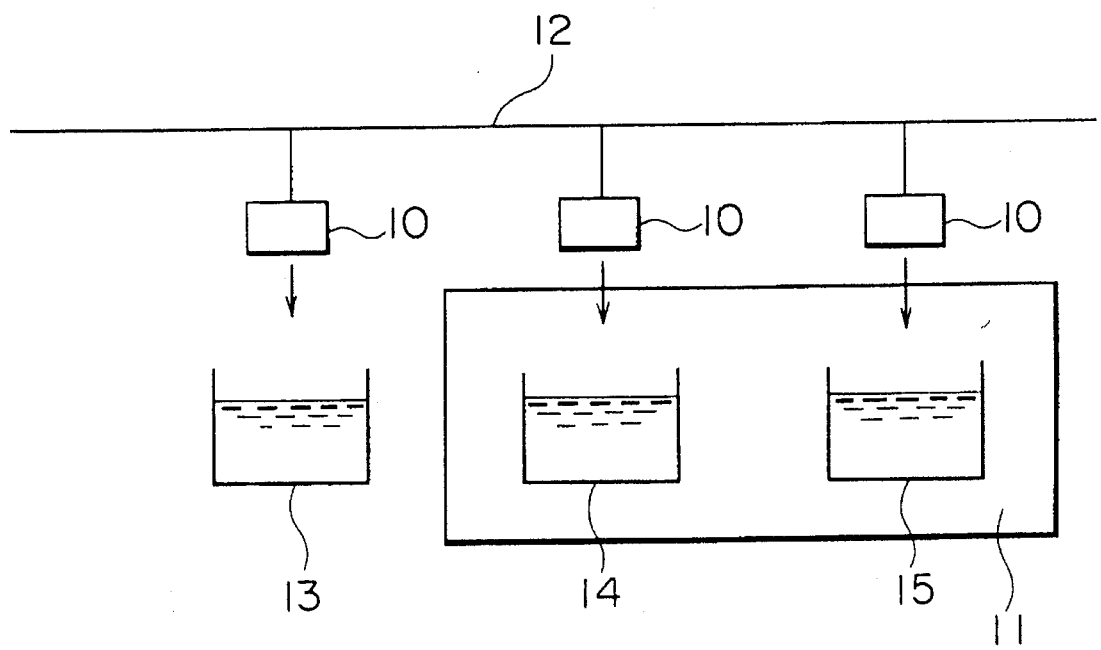
FIG. 4 schematically illustrates an apparatus used for producing a printed circuit board.

FIG. 1 is a cross-sectional view of copper surface at various treatment stages. FIG. 2 is a cross-sectional view of multi-layer printed circuit board. FIG. 3 is an enlarged schematic cross-sectional view of a treated copper surface. FIG. 4 schematically illustrates an apparatus used for producing a printed circuit board.

As shown in FIG. 4, the apparatus for producing a printed circuit board has an oxidizing tank 13 filled with an oxidizing solution for forming dark brown/black copper oxide on the roughened surface of a copper circuit pattern disposed on an insulating substrate which is printed circuit board 10, reducing tank 14 filled with a reducing solution for reducing the copper oxide on printed circuit board 10, plating tank 15 filled with a plating solution for forming a metallic film having metal particles discretely distributed therein on the surface of the reduced copper oxide, airtight container 11 for keeping the surface of reduced copper oxide in the state of being covered with non-oxidizing gas, and conveying means 12 which carries printed circuit boards 10 suspended therefrom and moves the boards forward with rising and falling at given intevals to immerse printed circuit boards 10 in tanks 13, 14, and 15.

Airtight container 11 encloses oxidizing tank 13 and reducing tank 14 and keeps them in an atmosphere of nonoxidizing gas such as inert gas.

Therefore, the surface of the reduced copper of printed circuit board 10 is kept from contacting with oxygen while printed circuit board 10 is carried from oxidizing tank 13 to reducing tank 14 and thus mechanical strength between copper foil and prepreg layer is maintained.

As non-oxidizing gas, there may be used any gases as long as they do not bring about an oxidation reaction or as long as they inhibit an oxidation reaction. A vacuum may also be employed.

Figure 1A:
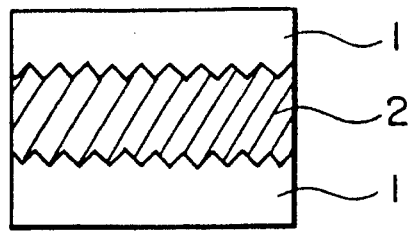
FIG. 1–3 show examples of the present invention.

FIG. 1(a) shows copper-clad laminate, (b) shows the laminate after having been subjected to soft etching, (c) shows the laminate after having been subjected to oxidation treatment, (d) shows the laminate after having been subjected to reduction treatment, and (e) shows the laminate after having been subjected to nickel treatment.

In FIG. 1(a), copper 1 of copper-clad laminate is provided on both sides of glass fabric-filled polyimide resin 2.

Figure 1B:
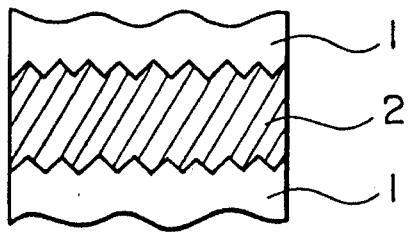

In FIG. 1(b), the surface of copper 1 of copper-clad laminate is roughened by soft etching.

Figure 1C:
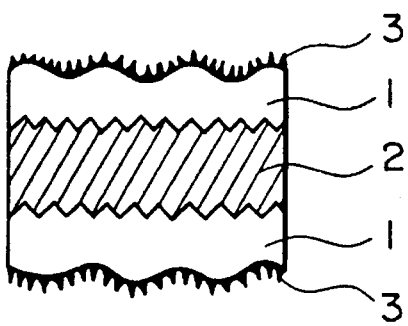

In FIG. 1(c), copper oxide 3 having fine irregularities is formed on the surface of copper 1 of copper-clad laminate.

Figure 1D:
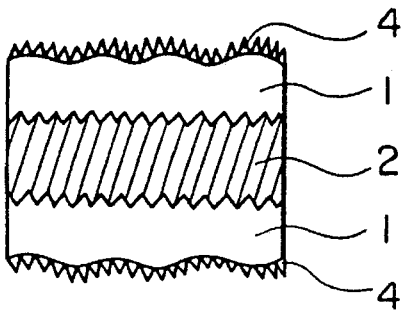

In FIG. 1(d), copper oxide 3 is reduced and reduced film 4 of the copper oxide is formed.

Figure 1E:
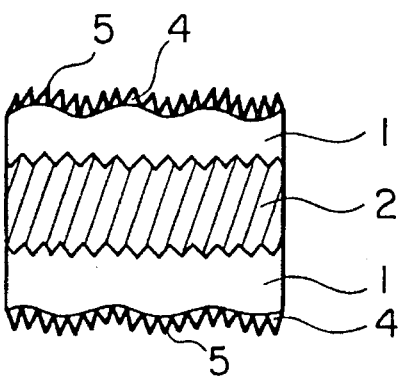

In FIG. 1(e), nickel film 5 is formed on the surface of reduced film 4 of copper oxide.

Figure 2A:
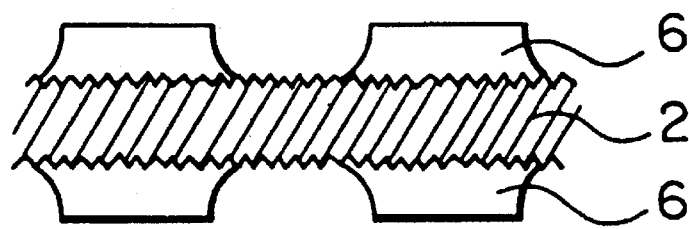
Figure 2B:
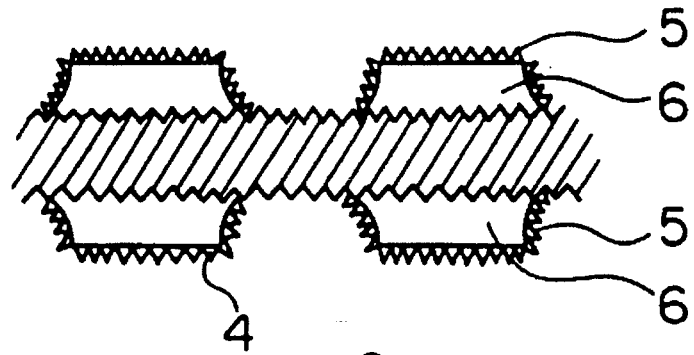
Figure 2C:
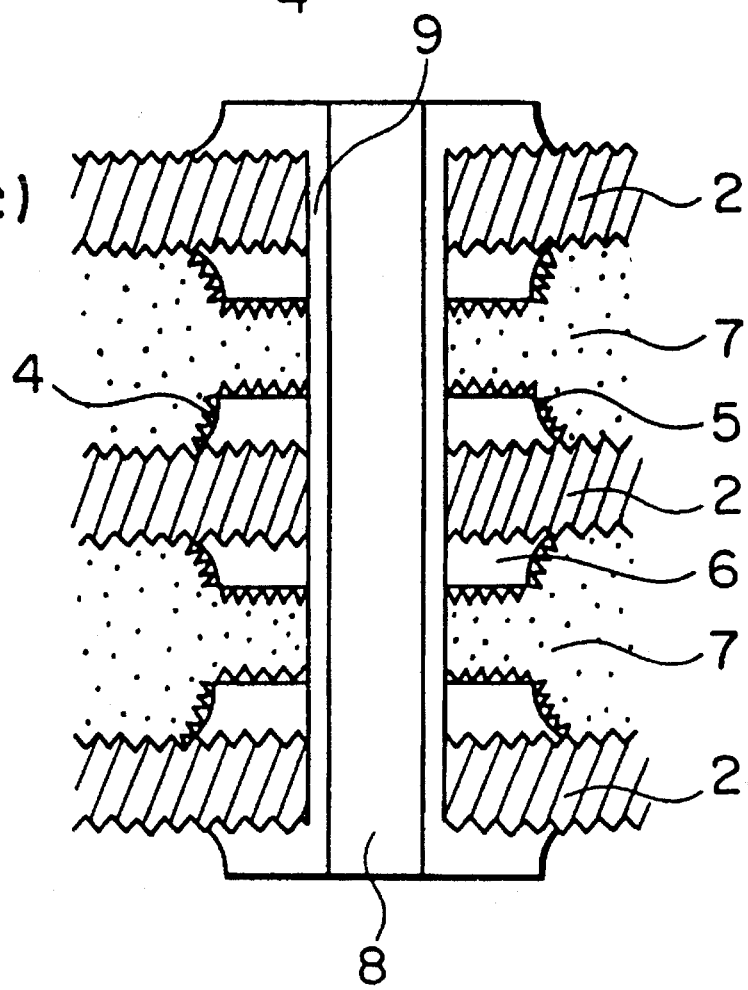
Figure 3:
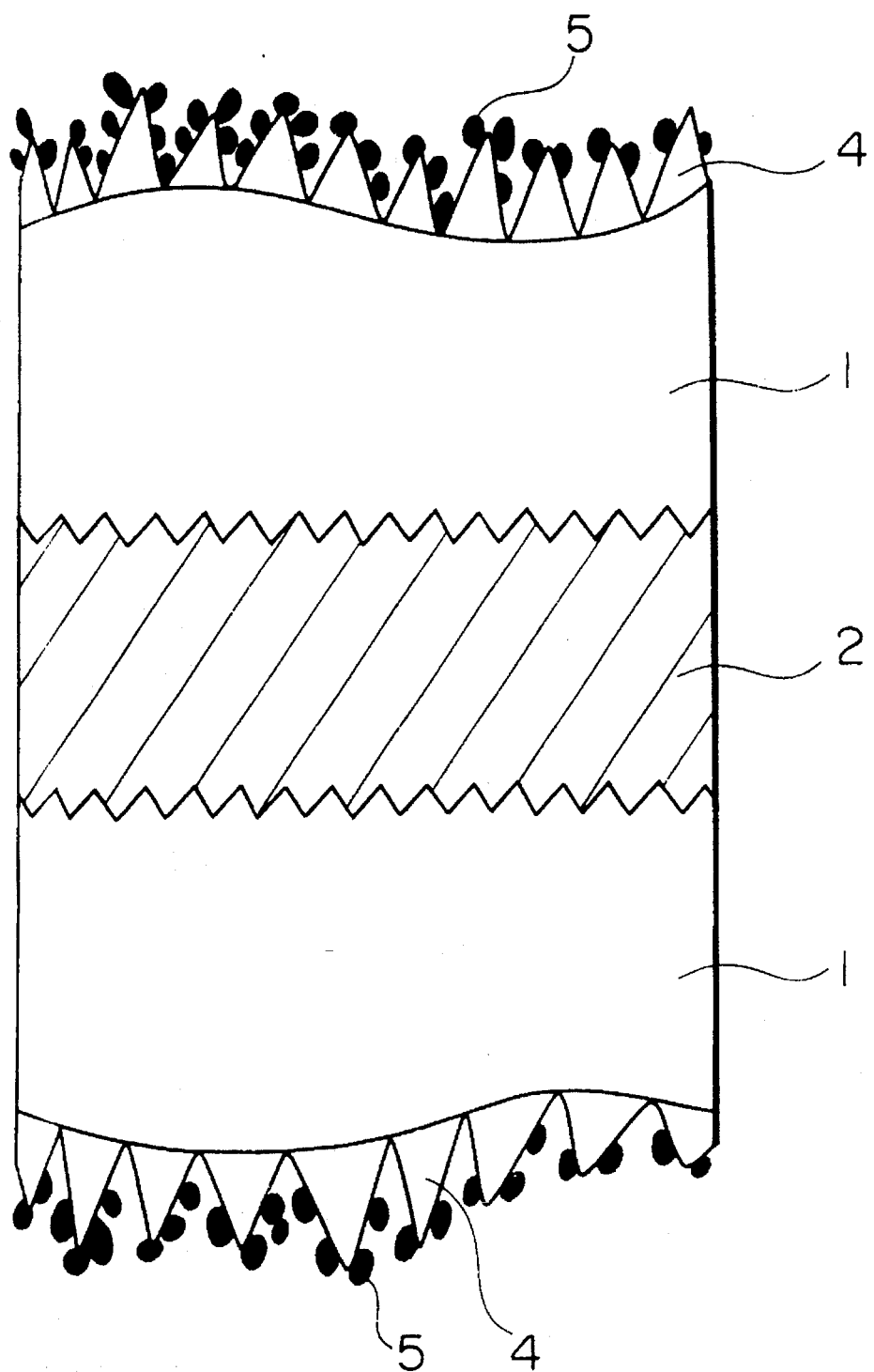

FIG. 2(a) shows a copper-clad laminate on which a circuit pattern is formed. FIG. 2(b) shows the copper-clad laminate of (a) which is subjected to oxidation treatment, then reduction treatment and furthermore nickel treatment. FIG. 2(c) shows multi-layer printed circuit board which comprises a plurality of circuit boards such as that of (b).

In FIG. 2(a), a circuit copper pattern 6 is provided on both sides of a glass fabric-filled polyimide resin 2.

In FIG. 2(b), reduced film 4 of copper oxide is formed on the surface of circuit copper pattern 6 and thereon is further formed nickel film 5.

In FIG. 2(c), prepreg layer 7 is interposed between the structures of FIG. 2(b) to make a laminate of three layers and through-hole 8 is formed through the laminate.

Thus, a multi-layer printed circuit board is formed.

The details of the nickel film 5 are described with respect to FIG. 3 in which reduced film 4 of copper oxide is in the form of fine irregularities and thin nickel film 5 formed on the reduced film comprises an aggregate of many fine particles which are discretely distributed.

Next, peel strength between copper foil side and prepreg layer was measured in order to evaluate mechanical strength of this printed circuit board.

As a result, a peel strength of laminated and bonded copper foil and prepreg layer was 1.2 kgt/cm$^2$.

Furthermore, in order to evaluate acid resistance, a through-hole was made after bonding the layers and the multi-layer printed circuit board was immersed in 17.5% HCl.

As a result, penetration of acid from the wall of the through-hole was not seen even after the board was immersed for more than 3 hours.

Example 2

A printed circuit board was made by the same steps as in Example 1 except that a glass fabric-filled epoxy resin was used in place of the glass fabric-filled polymide resin and the bonding was carried out by applying a pressure of 30 kgt/cm$^2$ for 120 minutes at 170° C.

Peel strength between copper foil side and prepreg epoxy resin was 2.2–2.5 kgt/cm$^2$. Resistance to HCl was also good and penetration of the acid from the wall of through-hole was not seen when the board through which a through-hole was made was immersed in 17.5% HCl for 3 hours.

Example 3

A printed circuit board was made in the same manner as in Example 1 except that an aqueous solution containing 5 g/l of ammonia borane of 40° C. was used in place of the reducing solution used in step-3. Reduction of copper oxide took place rapidly and nickel was uniformly deposited. Peel strength and acid resistance after bonding were as good as in Example 1.

Example 4

Printed circuit boards were made in the same manner as in Example 1 except that the following three marketed plating solutions (a)–(c) were used in place of the nickel plating solution used in step-4. These marketed nickel solutions contained 20–40 g/l of nickel salt and 2–10 g/l of boron compound. Deposition of nickel film took place rapidly and was uniform by using any of these nickel plating solutions. Peel strength and acid resistance after bonding were both as good as in Example 1.

Nickel plating solutions:

(a) Tradename: NICLAD 741 (manufactured by Okuno Seiyaku Co.)
  Concentration: 1/30 times the concentration of stock solution
  Temperature: 35° C.

(b) Tradename: SB-55-1 (manufactured by Kanzen Co.)
  Concentration: 1/30 times the concentration of stock solution
  Temperature: 35° C.

(c) Tradename: BEL 801 (manufactured by Kamimura Kogyo Co.)
  Concentration: 1/30 times the concentration of stock solution
  Temperature: 35° C.

Example 5

Prior to step (1), a circuit pattern was formed by etching the copper foil of copper-clad laminate using photoresist as a mask and the steps (1)–(5) of Example 1 were carried out. Thereafter, necessary through-holes were made by a drill and the through-holes were subjected to copper plating to make a multi-layer printed substrate.

This multi-layer printed substrate was evaluated for acid resistance. As a result, no discoloration of copper or bonded interface was seen even after the substrate was immersed in 17.5% HCl for 3 hours after making the through-holes.

Furthermore, mechanical strength at high temperature was also evaluated. As a result, bonding strength between copper and prepreg was superior and no peeling occurred even if it was floated on a solder of 288° C. for 60 seconds or more.

In order to inhibit oxidation of the surface of reduced copper oxide, it is preferred to carry out the plating step without treatment with water after the reducing step or to keep the surface of reduced copper in the state of being covered with boron based reducing agent by putting the printed circuit board, the copper oxide of which was reduced, in a container.

Furthermore, after the reducing step, a pre-dipping step may be provided for removing an oxide film produced spontaneously on the surface of reduced copper oxide in solution of boron compound of the plating step.

The boron based reducing agent and the solution of boron compound can contain at least one material selected from the group consisting of dimethylamine, diethylamineborane, ammonia borane and sodium borohydride.

According to the present inventions acid resistance and mechanical strength at high temperature can be enhanced and bond strength can also be increased.

Furthermore, a uniform thin plating layer of nickel or cobalt is formed on reduced copper layer.

What is claimed is:

1. A method for making a multi-layer printed circuit board having a higher mechanical strength at an increased temperature, the method comprising:
    a step of etching a copper surface of copper circuit pattern on an insulating substrate to roughen the copper surface;
    an oxidizing step of forming a dark brown/black copper oxide layer on the roughened surface of copper circuit pattern on both sides of the insulating substrate using an oxidizing agent;
    a reducing step of forming a reduced copper layer by reducing the copper oxide layer;
    a plating step of forming a metallic film having nickel or cobalt metal particles discretely distributed thereon on the surface of the reduced copper oxide layer in a plating solution containing a nickel salt or a cobalt salt and a boron compound free from palladium to form a layered body; and
    a step of water washing and drying the layered body and then laminating a plurality of the layered bodies, each separated by an insulating resin layer, followed by bonding the insulating resin layers under pressure;
    wherein no treatment with water is carried out between the reducing step and the plating step.

2. A method according to claim 1, wherein the bonding is carried out at a temperature in a range of 170° C. to 200° C.

3. A method for making a primed circuit board having a higher mechanical strength at an increased temperature, the method comprising:
    a step of etching a copper surface of copper circuit pattern on an insulating substrate to roughen the copper surface;
    a step of forming dark brown/black copper oxide on the roughened surface of copper circuit pattern on the insulating substrate using an oxidizing agent;
    a step of reducing said copper oxide; and
    a plating step of forming a metallic film having nickel or cobalt metal particles discretely distributed therein on the surface of said reduced copper oxide in a plating solution containing a nickel salt or a cobalt salt and a boron compound free from palladium:
    wherein no treatment with water is carried out between the step of reducing and the plating step.

4. A method according to claim 3, wherein the step of reducing reduces the copper oxide with a boron based reducing agent and the plating step performs the plating with a solution containing boron compound and nickel or cobalt free from palladium.

5. A method according to claim 4, wherein a step of keeping the surface of reduced copper oxide in the state of being covered with the boron based reducing agent is provided between the step of reduction and the step of plating.

6. A method according to claim 4, wherein a step of keeping the surface of reduced copper oxide in the state of being covered with a non-oxidizing gas is provided between the step of reduction and the step of plating.

7. A method according to any one of claims 5 or 6, wherein a predipping step for removing oxide film spontaneously produced on the surface of the reduced copper oxide in the solution of boron compound used in the step of plating is provided after the step of reduction.

8. A method according to any one of claims 5 or 6, wherein the boron based reducing agent and the solution of boron compound contain at least one compound selected from the group consisting of dimethylamine, diethylamine borane, ammonia borane, and sodium borohydride.

9. A method according to any one of claims 5 or 6, wherein concentration of reducing agent in the solution of boron compound in the step of plating is nearly equal to that in the boron based reducing agent.

10. A method according to claim 3 or 1 wherein the reducing step comprises a step of reducing the copper oxide with a boron based reducing agent and the plating step comprises a step of plating nickel or cobalt to a thickness of 10 to 2,000 angstroms.

11. A method according to claim 3 or claim 1, wherein the oxidizing agent is sodium chlorite.

12. A method according to claim 7, wherein the boron based reducing agent and the solution of boron compound contain at least one compound selected from the group consisting of dimethylamine borane, diethylamine borane, ammonia borane, and sodium borohydride.

13. A method according to claim 7, wherein concentration of reducing agent in the solution of boron compound in the step of plating is nearly equal to that in the boron based reducing agent.

14. A method according to claim 8, wherein concentration of reducing agent in the solution of boron compound in the step of plating is nearly equal to that in the boron based reducing agent.

* * * * *

UNITED STATES PATENT AND TRADEMARK OFFICE
CERTIFICATE OF CORRECTION

PATENT NO. : 5,472,563
DATED      : December 5, 1995
INVENTOR(S): Kiyonori Kogawa et al It is certified that error appears in the above-indentified patent and that said Letters Patent is hereby corrected as shown below:

| Column | Line | |
|---|---|---|
| 2 | 21 | Before "includes" delete "is". |
| 2 | 37 | After "state" insert --of--. |
| 3 | 16 | Before "surface" insert --the--. |
| 3 | 55 | Before "uniform" insert --a--. |
| 4 | 27 | Change "Cucl$_2$" to --CuCl$_2$--. |
| 7 | 56 | Change "primed" to --printed--. |

Signed and Sealed this

Twentieth Day of August, 1996

Attest:

BRUCE LEHMAN

*Attesting Officer*        *Commissioner of Patents and Trademarks*